United States Patent [19]

Fukuda

[11] Patent Number: 5,009,926
[45] Date of Patent: Apr. 23, 1991

[54] METHOD OF FORMING AN INSULATING FILM

[75] Inventor: Hisashi Fukuda, Tokyo, Japan

[73] Assignee: Oki Electric Industry Co., Ltd., Tokyo, Japan

[21] Appl. No.: 522,126

[22] Filed: May 11, 1990

[30] Foreign Application Priority Data

May 18, 1989 [JP] Japan .................................. 1-125420

[51] Int. Cl.$^5$ .............................................. B05D 3/06
[52] U.S. Cl. ......................................... 427/55; 427/58;
427/255.4; 427/255.7; 427/314; 427/374.1;
427/377; 427/379; 427/398.1
[58] Field of Search .............. 427/55, 58, 255.4, 255.7,
427/314, 374.1, 377, 379, 398.1

Primary Examiner—Bernard Pianalto
Attorney, Agent, or Firm—Wenderoth, Lind & Ponack

[57] ABSTRACT

In a method of forming an insulating film on a substrate wherein a substrate is cleaned by heating it in an atmosphere of a reducing gas, and heating it in an oxidizing gas, and then growing an insulating film by heating the substrate in an atmosphere of a gas used to grow the film in the same reaction chamber, the insulating film is grown in stages and an insulating film grown in each stage is crystallized by heat treatment with a temperature higher than the heat treatment for the film growth. This can be accomplished by interposing a heat treatment with the higher temperature between successive film growth stages, or by using a higher temperature for the film growth for each stage with a temperature higher than that for the film growth in the preceding stage.

22 Claims, 6 Drawing Sheets

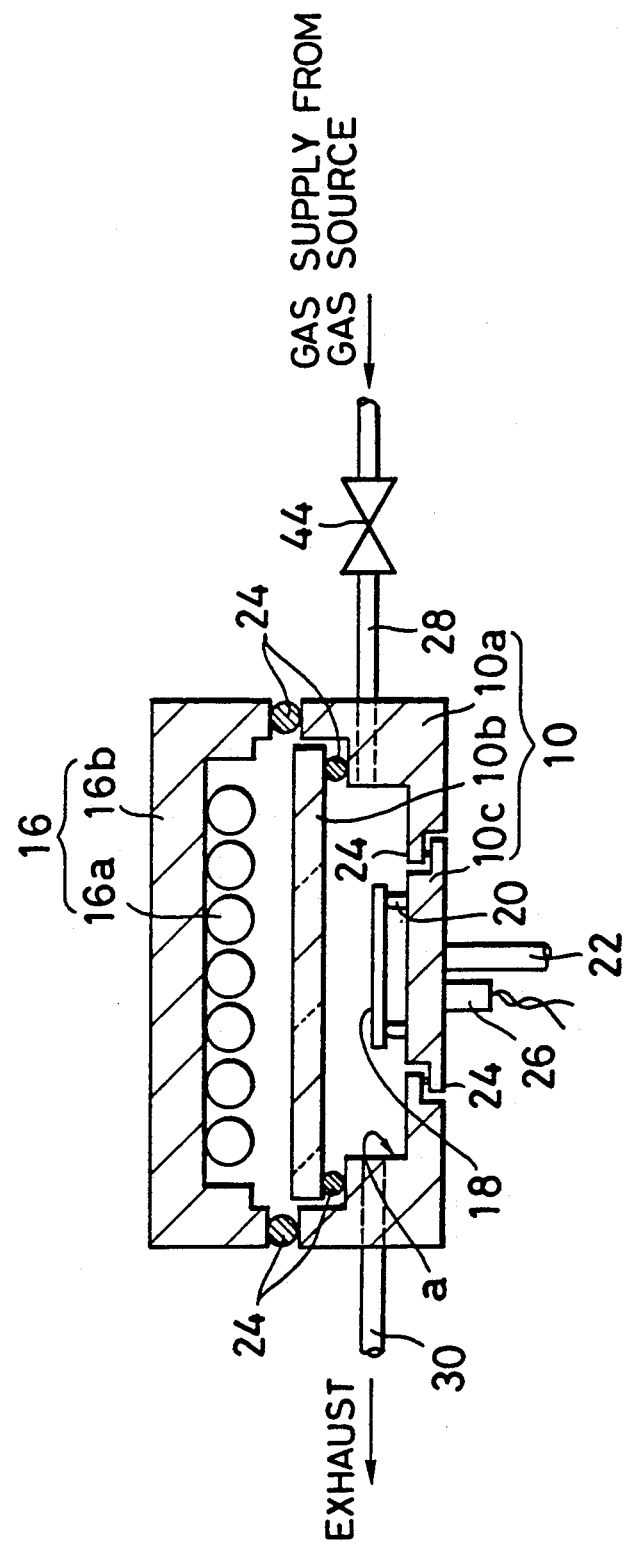

SILICON/SILICON OXIDE FILM
INTERFACE BY ORDINAY OXIDATION

SILICON/SILICON OXIDE FILM
INTERFACE AFTER CRYSTALLIZATION

METHOD OF FORMING AN INSULATING FILM

BACKGROUND OF THE INVENTION

This invention concerns a method of forming insulating films, and in particular a method of forming high quality insulating films of very small thickness.

In silicon integrated circuits, and in particular in MOS (Metal Oxide Semiconductor) integrated circuits formed by modern techniques, very thin oxide films are used as gate insulators. For sub-micron MOS devices which have gate lengths of 1.0 $\mu$m or less, the oxide film may for example be no more than 100 Angstroms thick, this reduction in thickness permitting substantial gains to be made.

These oxide films may be formed by the following method which is described in "MOSLSI Seizo Gijutsu" (The Manufacture of MOSLSI), by Takashi Tokuyama and Tetsuichi Hashimoto, published by Nikkei McGraw Hill Co., p. 64 (1985).

According to the method disclosed in this reference, a substrate that has been cleaned is placed in a quartz tube heated to 800°–1200° C. by an electric furnace, and an oxidizing gas is then introduced into the tube to form an oxidizing film. This oxidizing gas may for example be dry oxygen gas, or a mixture of oxygen gas and hydrogen gas, or a hydrochloric acid spray mixed with oxygen gas. As shown by the dotted line I in FIG. 4, which is a plot of oxidation time (sec) on the horizontal axis versus oxide film thickness (Angstroms) on the vertical axis, there is a definite relation between these two variables. It is therefore possible to form an oxide film of a desired uniform thickness on the substrate by allowing it to grow for a suitable time at a suitable temperature.

In the above method of forming oxide films, however, the film is grown continuously without interruption, and it was therefore difficult to control the thickness of very thin films in the region of 100 Angstroms or less. An attempt was made to solve this problem by reducing the oxidation temperature below 800° C. to decrease the rate of oxidation, or by diluting the oxygen with nitrogen.

At lower oxidation temperatures, however, the silicon/silicon dioxide interface is rougher. In the diluted oxidation method, on the other hand, nitrogen segregates at the silicon/silicon dioxide interface, and the interface state density is therefore increased. Both of these methods therefore failed to offer any improvement of properties such as the endurance against dielectric breakdown of thin oxide films.

Furthermore, the oxide films obtained at low temperatures or by diluted oxidation are generally not very dense. At the silicon/silicon dioxide interface, for example, there are a large number of unterminated bonds of silicon atoms or strained Si-O-Si bonds. As a result, the interface state therefore showed a tendency to increase. These phenomena gave rise to various problems when the oxide films were used as gate dielectric in MOSFETs. In MOSFETs with a gate length of 1.0 $\mu$m or less, for example, if hot electrons produced in the channel region are injected into the oxide film, the electrons were trapped by unterminated bonds of silicon atoms or strained Si-O-Si bonds, and a new interface trap state was generated. This led to an instability of the threshold voltage, or a degradation of the transconductance, in MOSFETs.

To solve these problems, the authors of the present invention carried out various studies and experiments. They then found that if the thin film was not grown continuously as in the prior art, but grown in several stages instead, there was no risk of surface roughness or of causing an increase in interface state density.

They also found that if the insulating film that was grown in several stages in this way, was crystallized prior to or at the same time as the next layer to be grown on top of the film, a high regularity compliance, high quality crystalline insulating film is obtained.

SUMMARY OF THE INVENTION

The aim of this invention is therefore to solve the problems of the prior art in providing a method of forming a thin insulating film of which the thickness can be accurately controlled, and which is of excellent quality.

In order to achieve the above objectives, a method of forming an insulating film on a substrate according to the invention comprises:

the step of cleaning a substrate by heating it in an atmosphere of a reducing gas, and heating it in an oxidizing gas;

the step of growing the insulating film by heating the cleaned substrate in an atmosphere of a gas used to grow the film, said step of growing being performed in the same reaction chamber as that used for said step of cleaning; and said step of growing being performed in stages;

the step of crystallizing the insulating film grown at each stage, by heating it with a temperature higher than the temperature used for the film growth for each stage;

said step of crystallizing being performed in the same reaction chamber as that used for said steps of cleaning and growing; and the step of cooling the substrate to room temperature between the step of film growth for each stage and the step of crystallization for each stage.

The substrate can be other than a silicon substrate, and the term "substrate" as used in the appended claims shall be construed to cover epitaxial layers formed on a silicon substrate, and any other substrate which permits the formation of an insulating film.

For example, said gas atmosphere used in said step of film growth is for example an oxidizing gas atmosphere, and said insulating film is an oxide film.

The structure of the crystalline insulating film obtained by said step of crystallization is preferably that of cristobalite.

The heating for said step of film growth and said step of crystallization is preferably performed by infrared light irradiation.

In a first aspect of the invention, said step of crystallization is performed between the steps of the film growth for successive stages.

The heat treatment for said step of crystallization may be performed in an inert gas atmosphere.

The heating temperature used for said step of film growth is preferably about 1000° C., and the heating temperature used for said step of crystallization is preferably no less than about 1350° C.

In the first aspect of the invention described above, the substrate is subjected alternately to heat treatment by infrared light radiation for a short time of a few seconds in a gas atmosphere to grow an insulating film, for example an oxidizing atmosphere, to cooling to room temperature to interrupt the film growth, and to heat treatment by infrared light radiation at a higher temperature than that used to grow the film, preferably in an inert gas atmosphere, to crystallize the oxide film that has been grown. In this way the insulating film grown in the preceding heating step, for example an oxide film, is crystallized in each heat treatment with a higher temperature, and a high quality insulating film with excellent crystalline properties, for example a silicon oxide film, is built up to a thickness of about several Angstroms.

In a second aspect of the invention, the film growth in each stage is conducted with a temperature higher than in said step of film growth in the preceding stage to serve also as said step of crystallization of the film grown during the immediately preceding stage.

The heating temperature used for said step of film growth of an initial stage is preferably no less than about 1000° C.

The heating temperature used for said step of film growth in a final stage is preferably about 1400° C.

In the second aspect of the invention described above, the substrate is subjected alternately to heat treatment by infrared light radiation for a short time of a few seconds in a gas atmosphere to grow an insulating film, for example an oxidizing atmosphere, and to a step of interrupting the film growth by cooling the substrate to room temperature. The temperatures of the heat treatments conducted in succession are progressively increased from about 1000° C. for the initial heat treatment to a higher specified temperature of about 1400° C. This sequence of operations is preferably carried out under reduced pressure, and the heating temperatures are carefully controlled.

In this way the insulating film, for example an oxide film, grown in the preceding heating step is crystallized in each heat treatment, and a high quality insulating film, for example a silicon oxide film, with excellent crystalline properties is built up with each layer being several Angstroms thick.

BRIEF DESCRIPTION OF DRAWINGS

FIG. 2 is a schematic sectional view of the main apparatus used to implement one example of the insulating film-forming method of this invention.

DETAILED DESCRIPTION OF THE PREFERRED EMBODIMENTS

This invention will now be described in more detail with reference to the drawings.

The drawings show the dimensions, shapes and positions of the components to the extent that is necessary to understand the invention. In the following description, specific materials and specific numerical conditions are mentioned, but it should be understood that these are only suitable examples and the invention is not limited to them in any way.

First, before describing the method of this invention, the apparatus used to implement it is described.

CONSTRUCTION OF A SUITABLE INSULATING FILM-FORMING APPARATUS TO IMPLEMENT THIS INVENTION

FIG. 2 is a schematic sectional view of the main parts (mainly the reaction chamber and the heating element) of the insulating film-forming apparatus required to implement the method of this invention. FIG. 2 shows the substrate installed in the reaction chamber.

Figure 3:
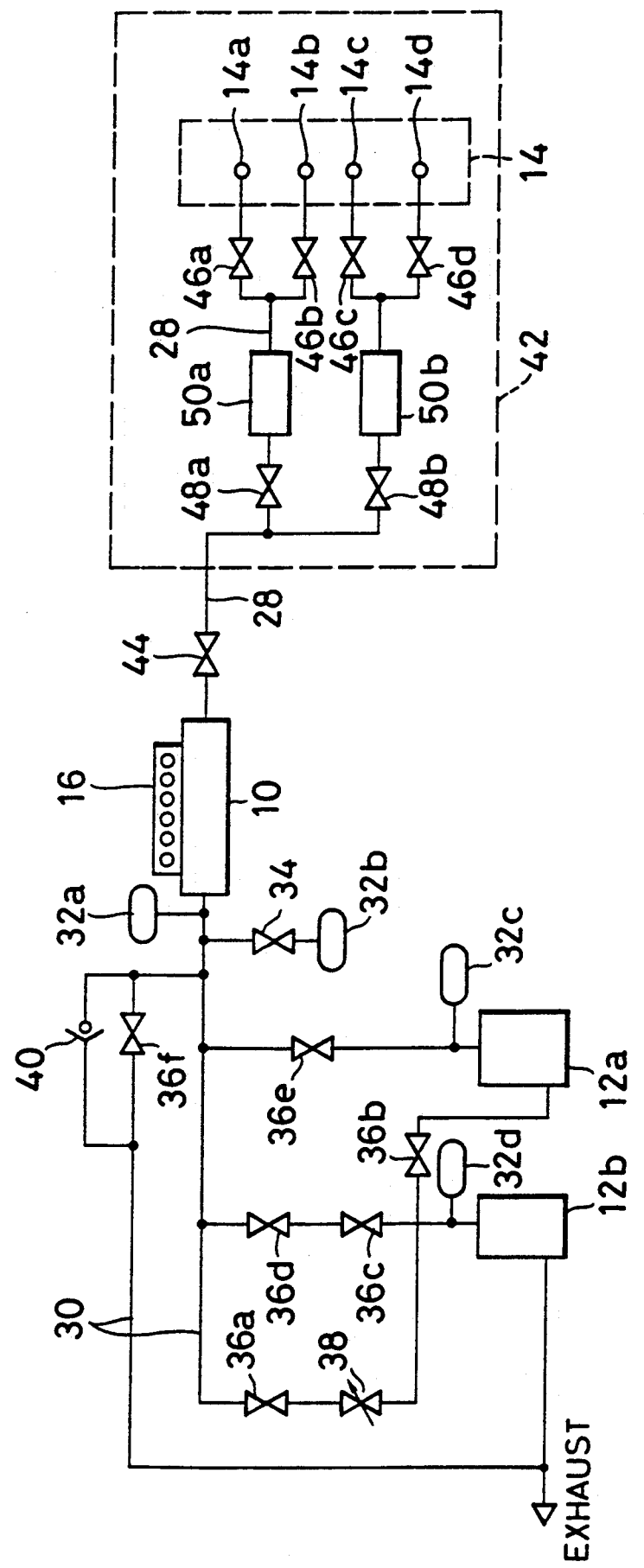
FIG. 3 is a schematic diagram of the structure of the whole apparatus used to implement one example of the insulating film-forming method of this invention.

FIG. 3 is a drawing for the purpose of explaining this embodiment of the invention, and is a schematic diagram of the whole structure of the insulating film-forming apparatus.

As seen from FIG. 3, the film-forming apparatus comprises a reaction chamber 10 in which the substrate is installed, an evacuation means 12 to place chamber 10 under vacuum, a gas supply means 14 and a heating element 16 to heat the substrate. Below, one example of the structure of this apparatus is described.

As shown in FIG. 2, in this embodiment, reaction chamber 10 may comprise for example a body 10a, a lid 10b and a lift platform 10c to raise and lower the substrate. The material of body 10a and of lift platform 10c may for example be stainless steel, while the material of lid 10b and supports 20 (described later) may for example be quartz.

Body 10a and lift platform 10c fit together to form the recess "a" shown in the figure. Supports 20 to mount substrate 18 are installed on the lift platform 10c of recess "a", the substrate 18 being inserted in or withdrawn from chamber 10 on supports 20 by the rising and lowering action of lift platform 10c. In the example shown in the figure, lift platform 10c is connected to a lifting device 22 which, for example, raises and lowers lift platform 10c mechanically.

Lid 10b fits on body 10a such that it can be freely attached or detached. Seals 24, for example bite-on packing, are provided between body 10a, lid 10b and lift platform 10c, and a vacuum can therefore be formed in chamber 10 via seals 24 when it is evacuated.

A means of measuring the surface temperature of substrate 18, for example an optical pyrometer, is installed near recess "a".

Further, in this example, heating element 16 is a means of infrared light radiation of suitable construction, and may for example comprise an infrared light lamp 16a and a support 16b which supports said means 16a. Infrared lamp 16a may be a tungsten halogen lamp or any other convenient lamp. It is preferable to install several lamps so that chamber 10 can be heated uniformly.

Infrared lamp 16a is normally installed outside chamber 10. In this case, part of chamber 10 is constructed of a material which is transparent to infrared light radiation, so that infrared light radiation is allowed to pass into chamber 10 from outside it. This material may for example be quartz, and lid 10b may for example be made of quartz.

Heating element 16 may be of such a construction, and may be installed in such a location, as may be convenient to carry out the heating process described below. It may for example consist of a heater which may be installed inside chamber 10.

The position of support 16b is not limited to this arrangement, but in the illustrated example, the support 16b is removably mounted to body 10a in such a manner that contacting part between support 16 and body 10a are enclosed between support 16b and body 10a, and also a seal 24 is provided between support 10b and body 10a. The provision of support 16b in this way therefore improves the vacuum sealability inside chamber 10.

In FIG. 2, 28 is a gas supply duct between chamber 10 and gas supply means 14, and 30 is an exhaust duct between chamber 10 and exhaust means 12.

Next, the vacuum exhaust system and gas supply system in this embodiment are explained, but it should be understood that these systems are not limited to those in the following description.

First, the vacuum exhaust system is explained. In this example, exhaust means 12 may comprise for example a turbomolecular pump 12a and a rotary pump 12b connected to pump 12a. Exhaust means 12 is connected to reaction chamber 10 via, for example, an exhaust duct 30 and valves arranged as shown in the diagram.

In FIG. 3, 32a-32d are vacuum gauges (or pressure gauges) connected to exhaust duct 30. Vacuum gauge 32a and 32d may for example be Varatron gauges used for measuring pressures in the range $1-10^{-3}$ Torr, while vacuum gauges 32b and 32c may for example be ion gauges used for measuring pressure in the range $10^{-3}-10^{-8}$ Torr. An automatic valve 34 is provided between vacuum gauge 32d and exhaust duct 30 to protect vacuum gauge 32b, and the opening and closing of valve 34 is controlled automatically such that a pressure greater than $10^{-3}$ Torr does not act on gauge 32b when the gauge operates. 36a-36f are automatic valves installed between exhaust means 12 and reaction chamber 10, and the pressure in chamber 10 is suitably controlled to create a high or low level of vacuum by opening and closing these valves 36a-36f as appropriate.

38 is a pressure regulating needle valve and 40 is a relief valve. Valve 40 opens automatically if the pressure in chamber 10 exceeds atmospheric pressure, for example 760 Torr, and gas supplied from gas supply means 14 to chamber 10 is evacuated by the opening of this valve.

The gas supply system will next be described. In this example, gas supply means 14 comprises a reducing gas source 14a, a reactive gas source 14b, an oxidizing gas source 14c, and a purge gas source, for example an inert gas source, 14d. Gas supply means is connected to chamber 10 via a supply duct 28 and valves installed as for example shown in the diagram.

In FIG. 3, 42 is a gas supply system, 44 is a valve, 46a-46d and 48a-48b are automatic valves, and 50a-50b are automatic flowrate controllers for the gas which is led from gas supply means 14 to the reaction chamber.

The desired gas can be introduced from gas supply means 14 to reaction chamber 10 by opening and closing valves 44, 48a, 48b and 46a-46d as appropriate.

EXAMPLE OF INSULATING FILM-FORMING METHOD OF FIRST ASPECT OF THE INVENTION

The insulating film-forming method of the first aspect of the invention will next be described. In this example, the insulating film is a silicon oxide film.

Figure 1A:
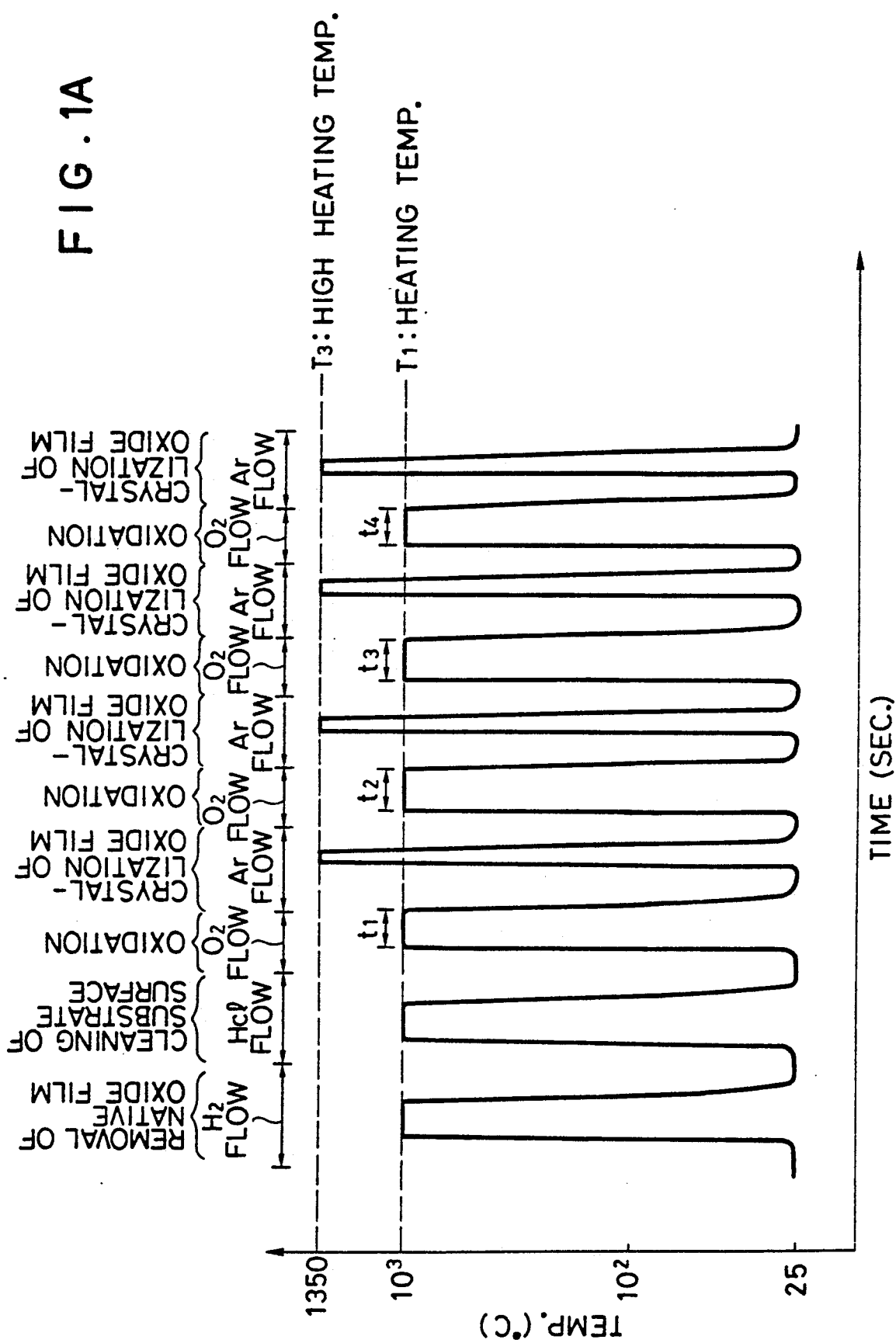
FIG. 1A and FIG. 1B are diagrams which explain the heating cycle in one example of the insulating film-forming method of the first and second aspects of the invention of this application.

FIG. 1A is a drawing to explain the thermal cycle in the first aspect of the invention. In the figure, the horizontal axis is time and the vertical axis is temperature.

Further, in this description, FIGS. 2 and 3 will also be referred to where convenient.

In this aspect of the invention, after installing substrate 18 in the reaction chamber 10, the substrate is cleaned, and the film-forming process is carried out. Below, these processes will be explained in order.

(1) Cleaning

The method used to clean the substrate before forming the insulating film has already been proposed by the authors of the present application, but as it is also suited to the method of this aspect of the invention, it will be described here.

In this example, a preliminary treatment is carried out before oxidation of substrate 18, for example a silicon substrate, by cleaning with chemical reagents and pure water as in the prior art.

The next preliminary treatment consists of introducing an inert purge gas, for example nitrogen, into chamber 10 to prevent the formation of a native oxide film on substrate 18. The reducing gas, reactive gas and oxidizing gas are not yet introduced in the chamber, so valves 44, 48b and 46d are open, while valves 48a and 46a-46c are closed.

Next, substrate 18 installed in chamber 10, and is fixed on the supports 20 of lift platform 10c.

After these preliminary arrangements have been completed, the surface of the substrate is cleaned. This cleaning process is carried out by heating substrate 18 in chamber 10, first in a reducing gas atmosphere and then in a reactive gas atmosphere.

Below, the processes used to clean the substrate will be described.

REMOVAL OF NATURAL OXIDE FILM

To clean the substrate, valves 48b and 46a are closed, and the supply of inert gas to the substrate 18 installed in chamber 10 is stopped.

Next, chamber 10 is evacuated to a high vacuum of for example, $1 \times 10^{-6}$ Torr by exhaust means 12 so as to clean the interior. For this evacuation, valves 38, 36a, 36e, 36f and 34 are closed, valves 36b, 36c and 36d are opened, and rotary pump 12b is actuated while monitoring the pressure inside chamber 10 on vacuum gauge 32a. After the pressure inside chamber 10 has reached $1 \times 10^{-3}$ Torr, valves 36c and 36d are closed, valves 36e and 34 are opened, and the chamber is then evacuated to $1 \times 10^{-6}$ Torr while monitoring the pressure on vacuum gauge 32b.

When chamber 10 has been placed under high vacuum, a reducing gas, for example hydrogen, is introduced into the chamber (see H$_2$ flow in FIG. 1A). The reducing gas is introduced such that the chamber can always be maintained under reduced pressure in the subsequent heating process, and for this purpose valves 36b, 36e and 34 are shut, and valves 38 and 36a are opened prior to opening valves 44, 48a and 46a to introduce the gas.

Furnace 10 is maintained under a reduced pressure while introducing reducing gas by manipulating valve 38, and by adjusting the gas flowrate by means of automatic flowrate controller 50a. In this way, chamber 10 is maintained at a low level of vacuum of $100-10^{-2}$ Torr.

Next, heating is carried out by heating element 16 to remove the native oxide film (FIG. 1). In this process, substrate 18 is heated in a reducing gas atmosphere, and the native oxide on the substrate is reduced and removed from the substrate. The heating of substrate 18 may be carried out for example by means of infrared light radiation. By carrying out the heating while the chamber is maintained under reduced pressure, the reaction products of the reduction of the native oxide film are evacuated outside the chamber, and the degree of contamination of the substrate 18 and chamber 10 by these products is suppressed.

In the heating process, the surface temperature of substrate 18 is controlled by measuring the temperature with measuring means 26 such that it increases at a suitable rate between 50° C./sec to 200° C./sec, and preferably at a rate of approx. 100° C./sec. When the temperature has reached approx. 1000° C., it is maintained at that level for approx. 10-30 sec.

The heating of substrate 18 by heating element 16 is then stopped, valve 46 is closed, the supply of reducing gas is stopped, and the surface temperature of substrate 18 is allowed to cool to room temperature, for example 25° C. The substrate may be allowed to cool naturally, or the cooling may be assisted. In the case of assisted cooling, valve 48a is closed, valves 48b and 46d are opened, and a large quantity of inert gas is introduced into the chamber.

Next, valves 38 and 36a are closed, valves 36b and 36e are opened, and chamber 10 is evacuated to a high vacuum of, for example, $1 \times 10^{-6}$ Torr in order to clean the interior.

CLEANING OF SUBSTRATE SURFACE

Valves 36b and 36e are closed, valves 38 and 36a are opened, and a reactive gas, for example prepared by mixing a spray of hydrogen chloride with hydrogen in a weight ratio of 1% to 99%, is introduced into the chamber (HCl flow in FIG. 1A). When the reactive gas is introduced, chamber 10 is maintained so that the subsequent heating step can be carried out under reduced pressure, for example $100-10^{-2}$ Torr, as in the case of heating in a reducing gas atmosphere.

Next, the substrate is heated by heating element 16. In this heating process, volatile products are generated by chemical reaction of thermally activated gas with substrate 18 and its impurities. This etches substrate 18, and the inorganic materials and other impurities adhering to it are removed. The thermal activation of the reactive gas may be carried out for example by irradiating the gas with infrared radiation. The heating is carried out while chamber 10 is maintained under reduced pressure, so volatile reaction products generated by etching substrate 18 are evacuated from the chamber, and the degree of contamination of substrate 18 and chamber 10 by these reaction products is suppressed.

In this heating process, if substrate 18 is also heated, the reactivity of substrate 18 and the impurities with the reactive gas is increased.

The etching of substrate 18 by reactive gas may for example be carried out for approx. 20 seconds while heating the substrate so that its surface temperature is maintained at approx. 1000° C.

The heating by heating element 16 is then stopped, valve 46b is closed, the supply of reactive gas is stopped, and the substrate 18 is allowed to cool to room temperature. This cooling may be a natural cooling, or it may be assisted.

Next, valves 38 and 36a are closed, valves 36b and 36e are opened, and chamber 10 is evacuated to a high vacuum of for example $1 \times 10^{-6}$ Torr.

(2) Growth of Oxide Film

Next, an oxide film is formed or grown on the substrate by heating it in an oxidizing gas atmosphere. For this purpose, valves 36b and 36e are closed, valves 38, 36a, 48b and 48c are opened, and an oxidizing gas, for example oxygen, is supplied to chamber 10 (see O$_2$ flow in FIG. 1A). In order to evacuate the reaction products from chamber 10 when the oxide film is grown, the chamber is maintained at a low vacuum, for example $100-10^{-2}$ Torr.

An oxide film is grown on the surface of substrate 18 by heating it with heating element 16.

The heating of substrate 18 may, for example, be carried out while measuring its surface temperature with measuring means 26, so that its temperature rises to approx. 1000° C. at a suitable rate between 50° C./sec–200° C./sec, and preferably at a heating rate (temperature rising rate) of 100° C./sec. The temperature is then maintained at approx. 1000° C. for approx. 2 sec–6 sec, and preferably for approx. 5 sec (time indicated by $t_1$ in FIG. 1A). It is preferable to maintain the heating rate constant in order to maintain the growth rate of the oxide or insulating film constant and obtain a high quality film. The heating rate is chosen within the above range from the viewpoints of controllability of film thickness and film quality. Further, the setting of the heating temperature $T_1$ to approx. 1000° C. is because this is the minimum temperature required to grow an insulating film. Further, $t_1$ is chosen to be approx. 2–6 sec from the viewpoints of controllability and/or film quality. By heating the substrate under these conditions, a thin, high quality oxide film of approx. 10 Angstroms can be grown.

The thickness of the oxide film may be controlled, for example, by adjusting the oxidation temperature, oxidation time and oxidizing gas flowrate.

When an oxide film of the desired thickness has been grown, the heating of substrate 18 is stopped.

Simultaneously with or after the heating is stopped, valve 46c is closed to stop the supply of oxidizing gas, and valve 46d is opened to replace the oxidizing gas in chamber 10 by an inert gas, for example argon (Ar) (Ar flow in FIG. 1A). By replacing the gas in the chamber with an inert gas, the oxide film is prevented from growing more than is necessary.

The substrate 18 is then cooled to room temperature, for example 25° C.

Figure 5A:
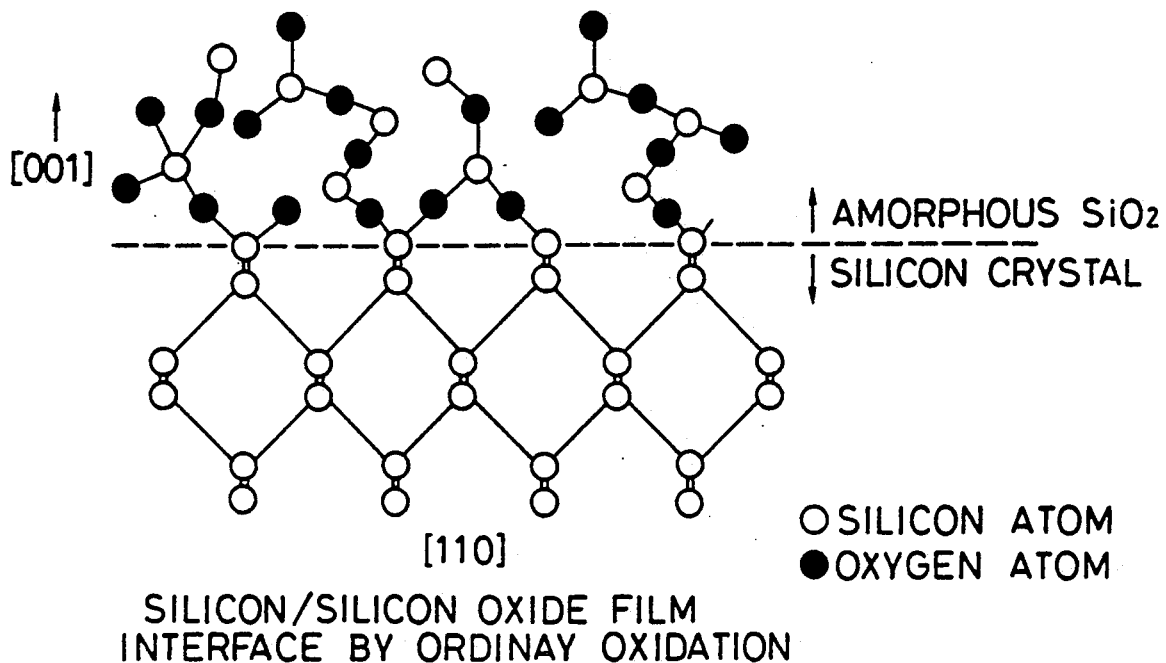
FIG. 5A and FIG. 5B are schematic diagrams of the silicon/silicon oxide film interface to assist understanding of this invention.

The oxide film obtained by these processes has an amorphous structure containing a large number of Si-Si bonds, Si-O bonds and O-O bonds with some unterminated bonds in the silicon/oxide film interface and in the oxide film (FIG. 5A).

To eliminate these unterminated bonds and to form an oxide film with a crystalline structure, the following heating process is carried out.

Figure 5B:
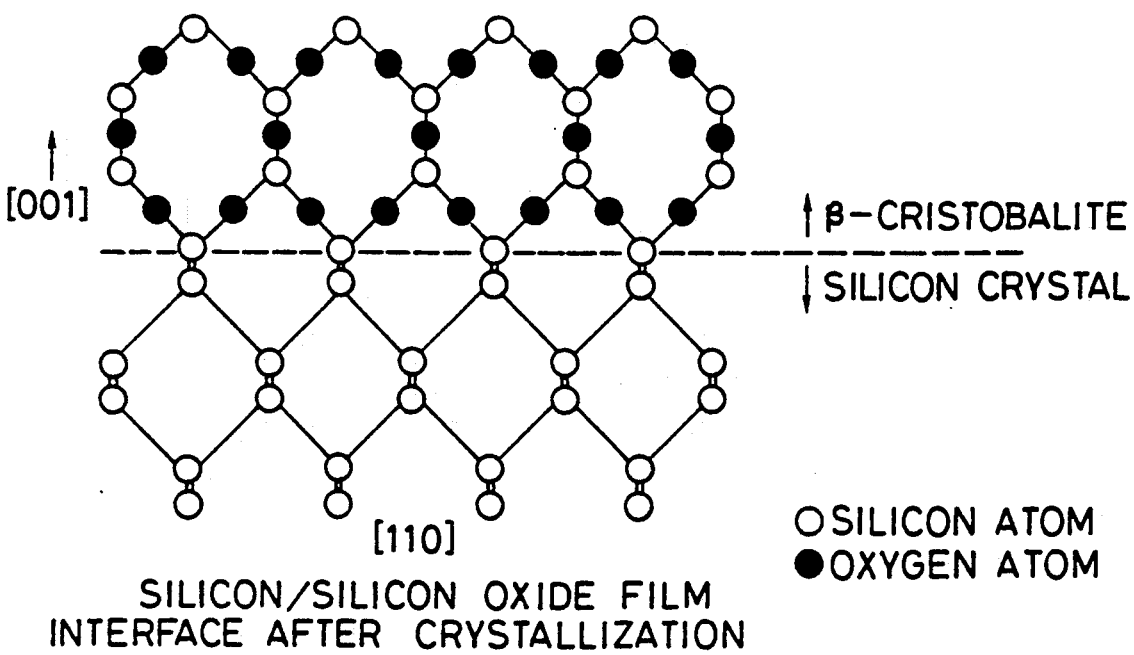

Valve 46d is opened, Ar gas is introduced into chamber 10 and substrate 18 is heated. To obtain a suitable crystalline structure, the heating of substrate 18 is carried out while measuring its surface temperature with measuring means 26 so as to raise its temperature to approx. 1350° C. at a programming rate of for example 200° C./sec, and its temperature is maintained at the high level $T_3$ of approx. 1350° C. for crystallization for approx. 2 sec. By heating the substrate under these conditions, the amorphous silicon oxide crystallizes into a β-cristobalite structure (FIG. 5B). The unterminated bonds in the silicon/oxide film interface and in the oxide film then disappear, and an extremely regular network is formed.

After this high temperature treatment to crystallize the oxide film, the substrate 18 is again cooled to room temperature. When substrate 18 has cooled to room temperature, for example 25° C., valve 46d is closed, valves 48b and 48c are opened, and oxygen is supplied to chamber 10. A second oxide film is then grown on the first crystallized oxide film by the same procedure as described above while maintaining the chamber 10 under a reduced pressure of $100-10^{-2}$ Torr (heating time $t_2$ in FIG. 1A).

As the upper part of the second oxide film grown by this heating process is amorphous, high temperature heating as described above is carried out again to induce crystallization.

As shown in FIG. 1A, the cycle comprising the growth of an oxide film, cooling to room temperature, and immediately afterwards raising the film to a high temperature for annealing to crystallize it, is repeated several times. In this way, the oxide film that has been grown is crystallized. The result is that a multi-layer crystalline oxide film is built up to a desired thickness (FIG. 1A). If for example the heating cycle is repeated four times, as shown in FIG. 1A, a film is obtained of which the thickness corresponds to the sum of the thicknesses grown in oxidation times $t_1$, $t_2$, $t_3$ and $t_4$ (the total film thickness is in practice determined by the total oxidation time $T=t_1+t_2+t_3+t_4$). Further, the time between one heating and the next, and the annealing time at the high temperature required to crystallize the film, may be suitably chosen as desired.

Figure 4:
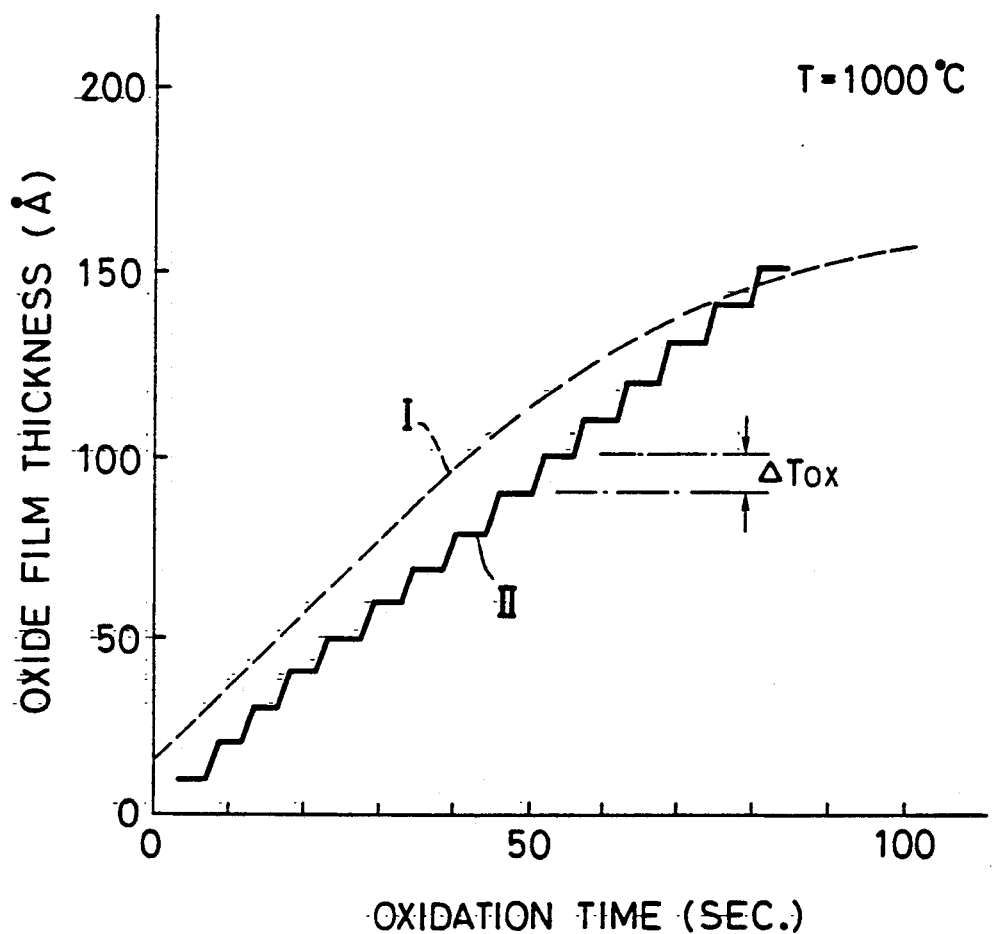
FIG. 4 is a graph of oxidation time versus oxide film thickness characteristics to assist understanding of the insulating film-forming method of this invention and the method of the prior art.

In FIG. 4, the solid curve II is the oxide film thickness - time characteristic in this embodiment of the invention. After first removing the native oxide film on substrate 18, an oxide film is grown of which the thickness increases in proportion to the oxidation time. If the oxidation time taken to grow each oxide film is constant, the thickness of the film which is obtained $\Delta$ Tox can be maintained substantially constant.

The crystalline film finally obtained has a $\beta$-cristobalite structure, and it is therefore a very satisfactory silicon/oxide film interface of high regularity.

After these oxidation processes, valves 36b and 36e are opened, and reaction chamber 10 is evacuated to a high vacuum of, for example, $1 \times 10^{-6}$ Torr in order to clean the interior of the chamber.

Following this evacuation, valve 46d is opened, and an inert gas is introduced into chamber 10 so as to maintain substrate 18 in an inert gas atmosphere.

EXAMPLE OF INSULATING FILM-FORMING METHOD OF SECOND ASPECT OF THE INVENTION

Figure 1B:
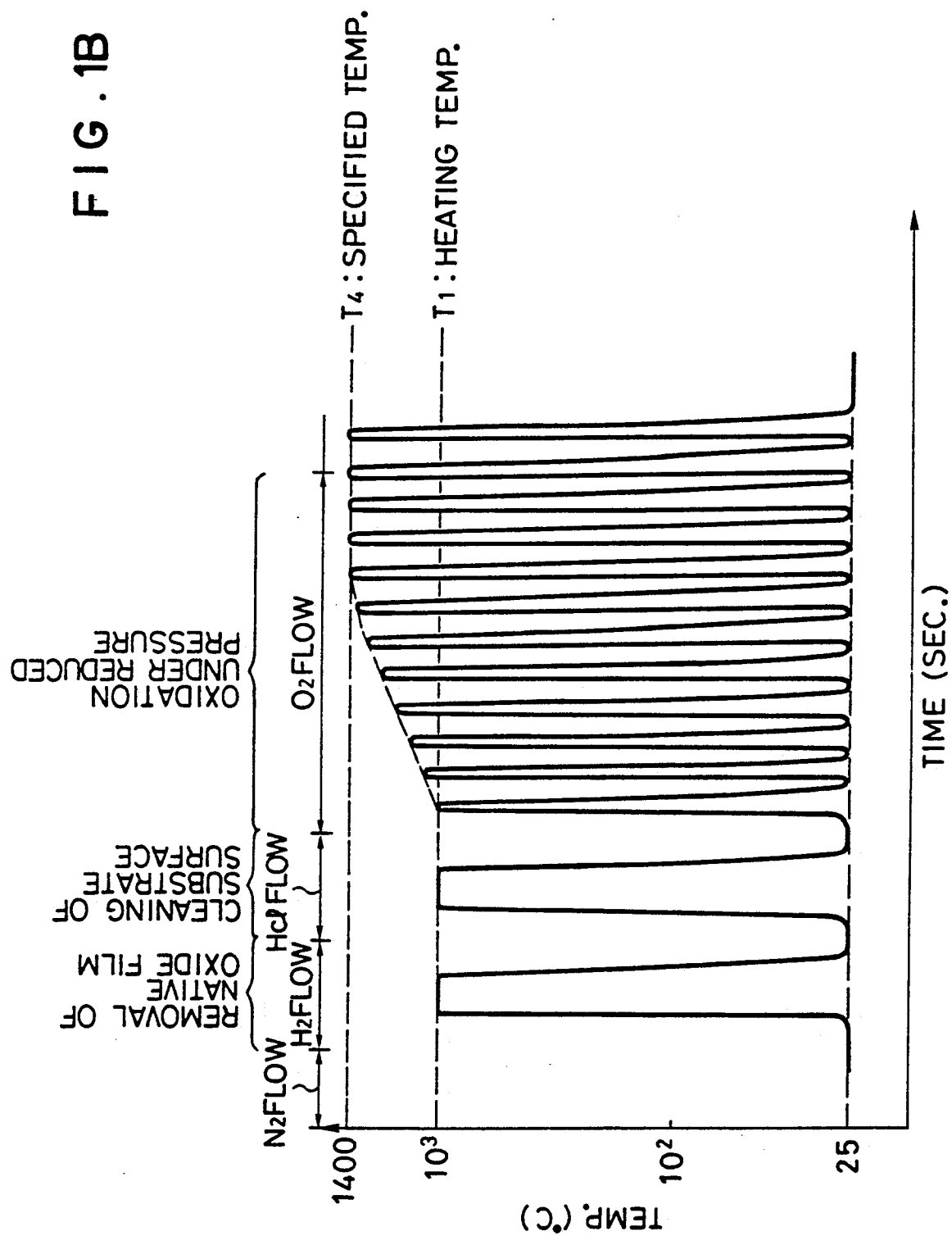

FIG. 1B is a drawing to explain the heating cycle used in the second aspect of the invention. The horizontal axis is time and the vertical axis is temperature.

In the following explanation, FIG. 2 and FIG. 3 will also be referred to where convenient.

In the method of the second aspect of the invention, some parts of the process are the same as those of the method of the first aspect of the invention. To avoid duplication, they are not repeated unless it is necessary, and only those points which are different are described.

(1) Cleaning

In this example, as in the case of the example of the first aspect of the invention, the silicon substrate 18 is installed in reaction chamber 10, and the substrate is cleaned (FIG. 1B: Removal of Natural Oxide Film and Cleaning of Substrate Surface), and then a silicon oxide film is grown on substrate 18 as an insulating film.

(2) Growth of Oxide Film

In the method of this example, as in the case of the first aspect of the invention, the chamber 10 is maintained under a low vacuum of $100-10^{-2}$ Torr, and heating is then carried out to grow the oxide film.

In this heating process, after a thin oxide film of for example several Angstroms is grown on substrate 18, the substrate is cooled to room temperature, for example 25° C., to interrupt the growth of the film. Next, a second oxide film of preferably the same thickness is grown on the first oxide film by heating, and the substrate is again cooled to room temperature to interrupt the film growth. The film growth and rest periods are repeated, and when the desired film thickness of no greater than 100 Angstroms has been built up, this sequence of cycles is terminated.

In the example of the second aspect of the invention, in the film growth cycle, annealing to a high temperature $T_3$ (1350° C.) to induce crystallization is not carried out as in the first aspect of the invention each time an oxide film is grown. Instead, in this second aspect of the invention, the heating temperature is increased progressively in steps at a certain programming rate each time an oxide film is grown up to a convenient final specified temperature $T_4$ decided in the design.

This will be explained in more detail.

After placing chamber 10 under reduced pressure, oxygen gas is introduced (reduced pressure oxidation and $O_2$ flow in FIG. 1B). The heating of substrate 18 is carried out such that while measuring its surface temperature with measuring means 26, its temperature is increased to an initial heating temperature $T_1$ of approx. 1000° C. at a suitable programming rate of between 50° C./sec-200° C./sec, and preferably of approx. 100° C./sec. The temperature is maintained at approx. 1000° C. for approx. 2-6 sec and preferably for approx. 2 sec from the viewpoint of controllability of film thickness and film quality. In this case, it is convenient to increase the temperature at a certain programming rate to maintain the growth of the insulating film constant and grow a good quality film. The programming rate is set within the above range also from the viewpoints of controllability of film thickness and obtaining a good quality film. Further, the heating temperature $T_1$ is set at approx. 1000° C. because this is the minimum temperature required to grow an insulating film. Under these conditions, a thin high quality oxide film of thickness approx. 5 Angstroms is grown by heating the substrate.

In this case also, the film thickness can be controlled by for example adjusting oxidation temperature, oxidation time and gas flowrate.

When a film of the desired thickness has been grown, heating of substrate 18 is stopped.

Next, the oxidation temperature alone is varied in order to carry out a second oxidation. This second oxidation is carried out at a suitable higher temperature, and from the viewpoints of controllability of film thickness, crystallization and/or film quality, this temperature should preferably be approx. 40° C. higher than that of the first oxidation.

The oxidation heating cycle is repeated as the oxidation temperature is increased in steps of about 40° C. at a time in order to reach the final temperature $T_4$ specified in the design, for example aprox. 1400° C. This specified temperature $T_4$ is in practice determined by the final film thickness which it is desired to obtain.

In this example, the oxide film obtained in the first heating process is an amorphous film containing a large number of Si-Si bonds, Si-O bonds and O-O bonds with unterminated bonds in the silicon/oxide film interface and the oxide film (FIG. 5A).

Further, in the second and subsequent oxide processes, this amorphous silicon oxide film is gradually crystallized, and changed into a β-cristobalite structure as shown in FIG. 5B. In this structure, the unterminated bonds of the Si-Si bonds, Si-O bonds and O-O bonds disappear, and an extremely regular network is formed.

The first and second aspects of the invention of this application are not limited to the examples described above, and many variations and modifications are clearly possible. For example, a silicon oxide film has been taken as an example of an insulating film, but the invention can also be applied to the formation of other oxide films apart from those of silicon, and other insulating films apart from oxide films such as nitride films. In this case, the gas used to grow the insulating film must of course be suited to the particular film which it is desired to grow.

Further, Ar has been taken as an inert gas, but other inert gases may of course be used.

Further, in the above examples, the substrate was allowed to cool to room temperature and room temperature was taken to be 25° C., but room temperature may not necessarily be 25° C., and need only be a temperature at which the film it is desired to form does not grow.

ADVANTAGES OF INVENTION

In the above description, it is clear that according to the film-forming methods of the first and second aspects of the invention of this application, a substrate is installed in a reaction chamber, the substrate is cleaned by heating in a reducing gas atmosphere and a reactive gas atmosphere, and the substrate is then heated in an oxidizing gas atmosphere or other gas atmosphere so as to grow an insulating film, for example of oxide, on its surface. In the first aspect of the invention, the substrate is heated to a high temperature in an inert gas atmosphere immediately after and each time an oxide film has been grown, so as to crystallize these films.

When the substrate is heated in a reducing gas atmosphere, the native oxide film on the substrate surface is reduced, and the native oxide film can thus be removed from the substrate. Further, by heating the substrate in a reactive gas atmosphere, the substrate is etched, and impurities adhering to the substrate are removed. In this way, the native oxide film and impurities on the substrate are removed, and the substrate can be cleaned as in the prior art.

The substrate can therefore be cleaned in the reaction chamber, and an insulating film for example of oxide can be grown while maintaining the substrate in the same degree of cleanliness. For this reason, not as many impurities are left in the substrate as in the prior art, and a purer, higher quality insulating film, for example an oxide film, can thus be formed.

Further, the insulating film is grown at a high temperature of 1000° C. or more, which is maintained for several seconds. It is therefore possible to grow an insulating film, for example an oxide film, which is of high quality in layers each of several Angstroms thickness. By repeating this process a thin insulating film, for example an oxide film, which has an overall thickness less than about 100 Angstroms can be formed with high controllability.

Further, in forming a silicon oxide film on a silicon substrate, in the method of the first aspect of the invention, the oxide film that has been grown is crystallized by heating in an inert gas atmosphere each time a film is grown. Further, in the method of the second aspect of the invention, the temperature in the oxidation process required to grow the film is increased in steps each time a film is grown. In both methods, the oxide film is crystallized. An extremely regular silicon/oxide film interface, and a good quality crystalline silicon oxide layer with very few unterminated bonds, can therefore be obtained.

What is claimed:

1. A method of forming an insulating film on a substrate wherein a substrate is cleaned by heating it in an atmosphere of a reducing gas, and heating it in an oxidizing gas, and then heating it in an atmosphere of a gas used to form the film in the same reaction chamber, characterized by repeating a cycle comprising a heat treatment to grow the insulating film on the substrate, a process wherein the substrate is subsequently cooled to room temperature, and a high temperature heat treament wherein it is then heated to a higher temperature than that used when growing the film in order to crystallize said insulating film, in the same reaction chamber.

2. A method according to claim 1 wherein said high temperature heat treatment is performed in an inert gas atmosphere.

3. A method according to claim 1 wherein the heating temperature used to grow the film is about 1000° C., and the high temperature heat treatment used to perform said crystallization is no less than about 1350° C.

4. A method according to claim 1 wherein the structure of the crystalline insulating film obtained by said high temperature heat treatment is that of cristobalite.

5. A method according to claim 1 wherein said film-forming heat treatment and said high temperature crystallization heat treatment are performed by infrared light irradiation.

6. A method according to claim 1 wherein said gas atmosphere for growing the insulating film is an oxidizing gas atmosphere, and said insulating film is an oxide film.

7. A method of forming an insulating film on a substrate wherein a substrate is cleaned by heating it in an atmosphere of a reducing gas, and heating it in an oxidizing gas, and then heating it in an atmosphere of a gas used to grow the film in the same reaction chamber, characterized by repeatedly performing a heat treatment to grow an insulating film of several Angstroms thickness interposed with film-forming rest periods wherein the substrate is cooled to room temperature,
and the heat treatment temperature is progressively increased in stages from the temperature of the initial treatment to a higher specified temperature, each of these heat treatments being intended to crystallize the insulating film which was formed in the heat treatment immediately preceding it.

8. A method according to claim 7 wherein said initial heat treatment temperature is no less than about 1000° C.

9. A method according to claim 7 wherein said specified temperature is about 1400° C.

10. A method according to claim 7 wherein the structure of the crystalline insulating film obtained by said heat treatment is that of cristobalite.

11. A method according to claim 7 wherein said heat treatment is performed by infrared light radiation.

12. A method according to claim 7 wherein said gas atmosphere for growing the insulating film is an oxidizing gas atmosphere, and said insulating film is an oxide film.

13. A method of forming an insulating film on a substrate comprising:
the step of cleaning a substrate by heating it in an atmosphere of a reducing gas, and heating it in an oxidizing gas;
the step of growing the insulating film by heating the cleaned substrate in an atmosphere of a gas used to grow the film;
said step of growing being performed in the same reaction chamber as that used for said step of cleaning; and
said step of growing being performed in stages;
the step of crystallizing the insulating film grown at each stage, by heating it with a temperature higher than the temperature used for the film growth for each stage;
said step of crystallizing being performed in the same reaction chamber as that used for said steps of cleaning and growing; and
the step of cooling the substrate to room temperature between the step of film growth for each stage and the step of crystallization for each stage.

14. A method according to claim 13 wherein said step of crystallization is performed between the steps of the film growth for successive stages.

15. A method according to claim 14 wherein the heat treatment for said step of crystallization is performed in an inert gas atmosphere.

16. A method according to claim 14 wherein the heating temperature used for said step of film growth is about 1000° C., and the heating temperature used for said step of crystallization is no less than about 1350° C.

17. A method according to claim 13 wherein said step of film growth in each stage is conducted with a temperature higher than said step of film growth in the preceding stage to serve also as said step of crystallization for said preceding stage.

18. A method according to claim 17 wherein the heating temperature used for said step of film growth of an initial stage is no less than about 1000° C.

19. A method according to claim 17 wherein the heating temperature used for said step of film growth in a final stage is about is about 1400° C.

20. A method according to claim 13 wherein the structure of the crystalline insulating film obtained by said step of crystallization is that of cristobalite.

21. A method according to claim 13 wherein the heating for said step of film growth and said step of crystallization is performed by infrared light irradiation.

22. A method according to claim 13 wherein said gas atmosphere used in said step of film growth is an oxidizing gas atmosphere, and said insulating film is an oxide film.

* * * * *